United States Patent
Chung et al.

(10) Patent No.: US 9,184,715 B2
(45) Date of Patent: Nov. 10, 2015

(54) METHOD AND APPARATUS FOR PROCESSING AUDIO IN MOBILE TERMINAL

(71) Applicant: Samsung Electronics Co., Ltd., Gyeonggi-do (KR)

(72) Inventors: Moonsik Chung, Seoul (KR); Sangwon Shim, Incheon (KR); Donghwan Bae, Seoul (KR); Sungwook Ji, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 334 days.

(21) Appl. No.: 13/706,514

(22) Filed: Dec. 6, 2012

(65) Prior Publication Data
US 2013/0148826 A1 Jun. 13, 2013

(30) Foreign Application Priority Data

Dec. 8, 2011 (KR) .................. 10-2011-0130768

(51) Int. Cl.
*H03G 3/00* (2006.01)
*H04R 29/00* (2006.01)
*H03G 3/20* (2006.01)
*H04M 1/60* (2006.01)
*H04R 3/00* (2006.01)
*H03G 3/04* (2006.01)

(52) U.S. Cl.
CPC .............. *H03G 3/20* (2013.01); *H03G 3/002* (2013.01); *H03G 3/04* (2013.01); *H04M 1/60* (2013.01); *H04R 3/00* (2013.01); *H04R 29/008* (2013.01)

(58) Field of Classification Search
None
See application file for complete search history.

(56) References Cited

U.S. PATENT DOCUMENTS

| 8,352,052 B1 * | 1/2013 | Green et al. .................. 700/94 |
| 2005/0195994 A1 | 9/2005 | Saito et al. |
| 2008/0070531 A1 * | 3/2008 | Kim et al. ..................... 455/219 |
| 2008/0159547 A1 | 7/2008 | Schuler et al. |
| 2011/0103617 A1 | 5/2011 | Shin |

FOREIGN PATENT DOCUMENTS

WO 2007/106384 A1 9/2007

* cited by examiner

*Primary Examiner* — Andrew L Sniezek
(74) *Attorney, Agent, or Firm* — Cha & Reiter, LLC.

(57) ABSTRACT

A method and an apparatus for processing audio data that controls pressure of a played sound to improve a quality of audio are provided. The method for processing audio in a mobile terminal includes: receiving the audio from a microphone; calculating by a controller a sound pressure level of the received audio; determining a sound pressure state of the received audio based on the calculated sound pressure level; and controlling an input gain of the audio based on the determination result.

18 Claims, 13 Drawing Sheets

METHOD AND APPARATUS FOR PROCESSING AUDIO IN MOBILE TERMINAL

CLAIM OF PRIORITY

This application claims the benefit of priority under 35 U.S.C. §119(a) from a Korean Patent Application Serial No. 10-2011-0130768 filed on Dec. 8, 2011 in the Korean Intellectual Property Office, the entire disclosure of which is hereby incorporated by reference.

BACKGROUND OF THE INVENTION

1. Field of the Invention

The present invention relates to a method and an apparatus for processing audio in a mobile terminal. More particularly, the present invention relates to a method and an apparatus for processing audio in a mobile terminal that controls recording and playback in the mobile terminal.

2. Description of the Related Art

In recent years, with the significant development of information and communication technology and a semiconductor technology, the supply and use of all types of portable terminals have rapidly increased. In particular, recent portable terminals have developed to a convergence stage for use in portable terminals including traditionally separate fields. For example, the mobile terminal preferably includes a camera, a speaker, a microphone, and a broadcasting/receiving module such that recording, audio playback, and video playback may be performed. Further, the mobile terminal includes a process and the means for processing audio such that such recording and playback may be controlled.

However, the known process and apparatus in the related art for processing audio of the related art does not provide a function controlling the recording according to a surrounding environment. However, the related art provides a function allowing a user to control magnitude, namely, volume of a played voice. In general, a microphone of a mobile terminal has limits on controlling the performance when recording.

When various sounds are recorded in a situation using one microphone (i.e., a single microphone), it is difficult to control a strength of input sound, namely, sound pressure level (unit thereof is typically measured in decibels (dB)), and too high a level may cause distortion of the audio to be stored in the mobile terminal. The sound pressure level may be expressed, for example as a ratio of a level of sound pressure input to the microphone to an allowed maximum sound pressure. In other words, if the sound pressure input is equal to or greater than the maximum sound pressure allowed (i.e. a maximum pressure that can be received by the microphone without causing at least some distortion in the mobile terminal when the sound is recorded and/or the audio is played), distortion occurs due to saturation of sound pressure. In the case of distortion occurring, a tearing sound may be caused that is grating on ears when the audio is output. Furthermore, conventional methods and apparatus for processing audio do not provide a function of controlling display of the sound pressure status level of audio being played and/or recorded, so that a user cannot easily recognize a level of distortion of the audio being played and/or recorded. Typically, the user listens to the output voice and subjectively recognizes a sound pressure state.

SUMMARY OF THE INVENTION

It is an aim of certain embodiments of the present invention to address, solve, mitigate or obviate, at least partly, at least one of the problems and/or disadvantages associated with the related art, including the problems and/or disadvantages mentioned above. Certain embodiments aim to provide at least one of the advantages described below.

The present invention provides a method and an apparatus for processing audio that controls pressure of a played sound to improve quality of audio.

The present invention further provides a method and apparatus for processing audio that may notify a sound pressure state of the audio to a user, such that the user can edit or prevent distorted audio from being recorded or played at an undesirable level of sound pressure.

In accordance with an exemplary aspect of the present invention, a method for processing audio in a mobile terminal preferably includes: receiving the audio from a microphone; calculating sound pressure of the received audio; determining a sound pressure state (status) of the received audio based on the calculated sound pressure; and controlling an input gain of the audio based on the determination result.

In accordance with another exemplary aspect of the present invention, an apparatus for processing audio in a mobile terminal, preferably includes: a microphone outputting audio; a controller calculating sound pressure of the received audio from the microphone, and determining a sound pressure state (status) of the received audio based on the calculated sound pressure, and controlling an input gain of the audio based on the determination result; a display unit displaying the determined sound pressure state information under control of the controller; and a memory storing the audio received from the controller and the determined sound pressure state information under control of the controller.

Another aspect of the present invention provides a computer program comprising instructions arranged, when executed, to implement a method, system and/or apparatus, in accordance with any one of the above-described aspects. A further aspect provides machine-readable storage storing such a program.

Other aspects, advantages, and salient features of the invention will become apparent to those skilled in the art from the following detailed description, which, taken in conjunction with the annexed drawings, disclose exemplary embodiments of the invention.

BRIEF DESCRIPTION OF THE DRAWINGS

The above features and advantages of the present invention will become more apparent to a person of ordinary skill the art from the following detailed description in conjunction with the accompanying drawings, in which.

DETAILED DESCRIPTION

Figure 1:
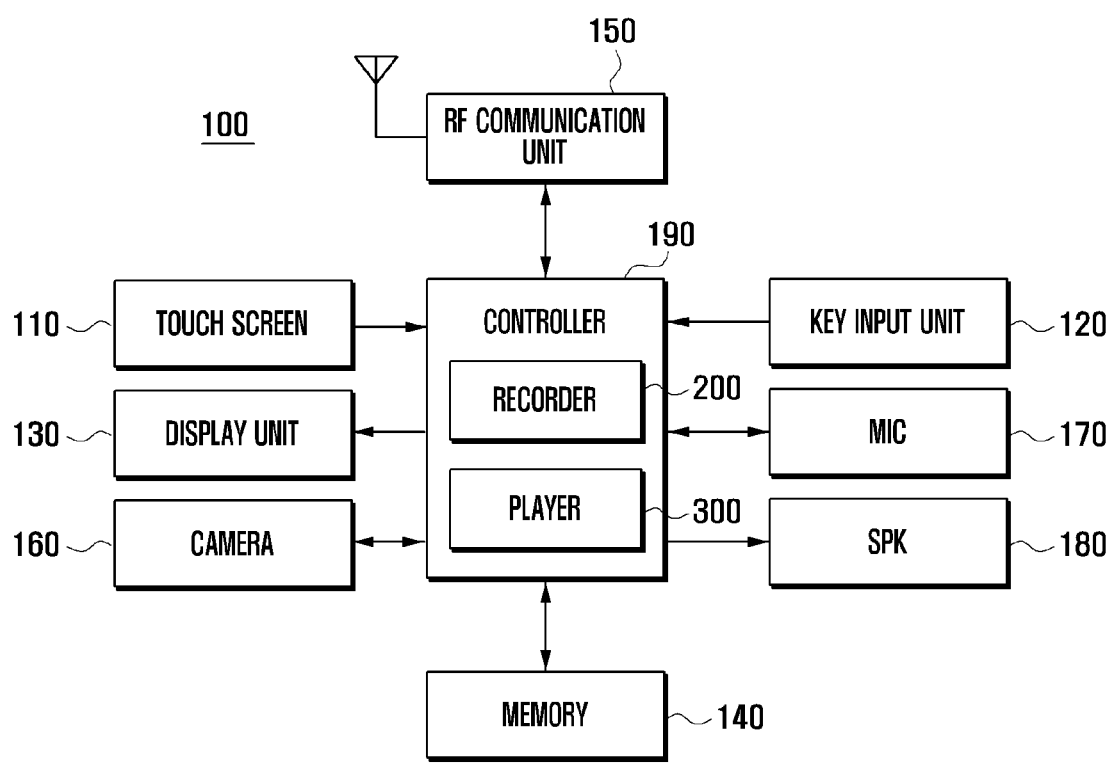
FIG. 1 is a block diagram illustrating a configuration of a mobile terminal according to an exemplary embodiment of the present invention.

A method and an apparatus for processing audio according to exemplary embodiments of the present invention are described with reference to the accompanying drawings in detail.

The following description of exemplary embodiments of the present invention, with reference to the accompanying drawings, is provided to assist in a comprehensive understanding of the present invention, as defined by the claims. The description includes various specific details to assist in that understanding but these are to be regarded as merely exemplary. Accordingly, those of ordinary skill in the art will recognize that various changes and modifications of the embodiments described herein can be made without departing from the scope of the invention.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims.

The same or similar components may be designated by the same or similar reference numerals although they are illustrated in different drawings. Detailed descriptions of structures, constructions, functions or processes known in the art may be omitted for clarity and conciseness, and to avoid obscuring the subject matter of the present invention.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, it is to be understood that the singular forms "a," "an," and "the" include plural referents unless the context clearly dictates otherwise, and where the indefinite article is used, the specification is to be understood as contemplating plurality as well as singularity, unless the context requires otherwise. Thus, for example, reference to "an object" includes reference to one or more of such objects.

Features, integers, characteristics, compounds, chemical moieties or groups described in conjunction with a particular aspect, embodiment or example of the invention are to be understood to be applicable to any other aspect, embodiment or example described herein unless incompatible therewith.

It will be also be appreciated that, throughout the description and claims of this specification, language in the general form of "X for Y" (where Y is some action, activity or step and X is some means for carrying out that action, activity or step) encompasses means X adapted or arranged specifically, but not exclusively, to do Y.

As used herein, a "sound pressure state" will be referred to in the examples herein as having at least three relative values as would be understood by a person of ordinary skill in the art. The at least three states are (1) saturation state, (2) normal operating state, and (3) low-level state. The skilled person will appreciate that other levels and states may be defined.

For example, when a sound pressure state is in a "saturation state", an artisan will appreciate that this refers to a state in which sound pressure of audio is saturated. In other words, the saturation state refers to a state in which the sound pressure of audio is higher than a maximum sound pressure allowed in a mobile terminal (e.g. a maximum sound pressure that a microphone can receive and/or a maximum sound pressure that a speaker can generate). The maximum sound pressure may depend on performances of a microphone and a speaker included in the mobile terminal. In other words, the maximum sound pressure means a threshold point at which distortion of sound occurs due to saturation of sound pressure. A normal operating state means a stable state in which sound pressure of audio is not saturated relative to the threshold point at which distortion occurs. A low level state means a state in which sound pressure level of audio is not saturated and also the sound pressure level is very low (i.e., below −20 dB). In other words, the low level state means a state that the sound pressure level of audio is lower than the lowest sound pressure level (i.e., −20 dB) set in the mobile terminal. For example, a low level state may refer to a sound pressure which is no greater than a noise level (e.g. too small to be detected by a microphone above noise, and/or too small to be generated by a speaker above noise).

The normal operating state means a state that the sound pressure level of audio is lower than the highest sound pressure level (i.e., 0 dB) set in the mobile terminal and higher than the lowest sound pressure level (i.e., −20 dB) set in the mobile terminal. That is, a case in which a sound pressure level falls with a range between the lowest sound pressure level and the highest sound pressure level may be defined as the normal operating state.

The method and the apparatus for processing audio according to the embodiments of the present invention are applicable to a plurality of different types of electronic devices, including a mobile terminal and many other portable devices. It is apparent that the mobile terminal may be embodied, for example, as a portable phone, a smart phone, a tablet PC, a hand-held PC, a Portable Multimedia Player (PMP), a Personal Digital Assistant (PDA), just to name a few non-limiting possibilities. Hereinafter, it is assumed that the method and the apparatus for processing audio according to the present invention is applicable to the mobile terminal.

The method and the apparatus for processing audio according to an exemplary embodiment of the present invention provides at least one or more of a function of controlling sound pressure of audio in a normal operating state upon recording, a function of notifying a sound pressure of audio upon playback, and a function of editing the audio. The functions according to the present invention will be described in detail below. Detailed descriptions of well-known functions and structures incorporated herein may be omitted to avoid obscuring appreciation of the subject matter of the present invention by a person of ordinary skill in the art.

FIG. 1 is a block diagram illustrating a configuration of a mobile terminal according to an exemplary embodiment of the present invention. Referring now to FIG. 1, the mobile terminal 100 according to the present invention preferably includes a touch screen 110, an optional key input unit 120, a display unit 130, a memory 140, a radio frequency (RF) communication unit 150, a camera 160, a microphone 170, a speaker 180, and a controller 190.

The touch screen 110 is installed in front of a display unit 130, and generates and transfers a touch event according to a touch gesture of a user with respect to the touch screen 110 to the controller 190. Accordingly, the controller 190, which comprises hardware such as a processor or microprocessor, may sense a touch gesture of a user from a touch event input from the touch screen 100 and control the foregoing structural elements. Here, the user operation may be classified into categories such as touch, tap, double tap, press, drag, drag & drop, and sweep. Here, the touch is an operation where a user pushes one point of a screen. The tap is an operation where a finger escapes (i.e. is removed) from a corresponding point of the touch screen without movement of the finger after touching the corresponding point. The double tap is an operation where a user continuously touches one point of the touchscreen twice. The press is an operation where a finger escapes from a corresponding point of the touchscreen without movement of the finger after touching the touchscreen longer than the touch-duration of the tap. The drag is an operation that moves a finger in a predetermined direction along a touchscreen in a state at which one point of the touchscreen is touched. The drag & drop is an operation that escapes a finger after drag. The sweep is an operation that removes a finger from the touchscreen after moving it by bouncing at high speed. Here, the drag is called scroll and the sweep is called a flick. The controller 190 may distinguish the sweep and the drag with each other at moving speed. Further, a resistive type, a capacitive type, and a pressure type are applicable as the touch screen 110.

The key input unit 120 may include, for example, a plurality of input keys and function keys for receiving input of numerals or character information, and setting various functions. The function keys may include arrow keys, side keys, and hot keys set to perform a certain function. Further, the key input unit 120 generates and transfers key signals associated with setting a use right and function control of the mobile terminal to the controller 170. The key signals may include a power on/off signal, a volume control signal, and a screen on/off signal. The controller 170 controls the foregoing structural elements according to the key signals. The key input unit 120 may be implemented by a Qwerty key pad, a Dvorak key pad, a 3*4 key pad, and a 4*3 key pad having a plurality of keys, just to name some non-limiting examples. Further, when a touch screen 110 of the mobile terminal is supported in the form of a full touch screen, the key input unit 120 may include at least one side key for screen on/off and on/off of the mobile terminal, which is provided at a side of a case of the mobile terminal.

The display unit 130, which preferably comprises a thin-film technology display, converts a digital image input from the controller 190 into analog image and displays the analog image under control of the controller 190. In other words, the display unit 130 may provide various screens, for example, a lock screen, a home screen, an application (referred to as 'App' hereinafter) execution screen, a menu screen, a key pad screen, a message creation screen, an Internet screen, and the like. If the screen of the display unit 130 is turned-on, the lock screen may be defined as a displayed image of a lock, some other image, or possible the word "lock" being displayed. When a certain touch event for lock release occurs, the controller 190 may switch the displayed image from the lock screen to the home screen or the App execution screen, the home screen may be defined as an image including a plurality of App icons corresponding to a plurality Apps, respectively. If one is selected from the App icons by a user, the controller 190 executes a corresponding App, for example, a recording App. Further, the display unit 130 displays an execution screen for executing a selected App. Moreover, the display unit 130 may display one of the screens as a main screen, and display another screen to overlap the display of the main screen at least partially as a sub-screen. For example, the display unit 130 may display an App execution screen and display a key pad screen thereon to overlap the App execution screen. In addition, the display unit 130 may be configured by a flat panel display panel form such as a Liquid Crystal Display (LCD), an Organic Light Emitted Diode (OLED), and an Active Matrix Organic Light Emitted Diode (AMOLED), just to name some possible examples.

The memory 140, which may be a non-transitory machine readable medium, may store various types of data as well as an operating system (OS) of the mobile terminal and various applications. The memory 140 may chiefly include a data area and a program area. The data area of the memory 140 may store, for example, data created from the mobile terminal according to use of the mobile terminal 100 or downloaded from the outside, and attribute information indicating an attribute of the data. Here, the data may become contact points, documents, images, audio, video, and the like. Further, the attribute information may become capacity information (byte), category information, or the like. Particularly, when the data is audio, the attribute information may include sound pressure state information. Moreover, the data area may store the foregoing screens displayed on the display unit 130. Further, the data area may temporarily store data copied from messages, photographs, web pages, documents, and the like for insertion or the like. The memory may also include a number of buffers, cache memory, etc. Moreover, the data area may store various setting values (for example, presence of automatic control of sound pressure upon recording) for operating the mobile terminal. The program area of the memory 140 may store an OS and various applications for booting the mobile terminal 100 and operating respective structural elements of the mobile terminal 100. In particular, the program area may store a recording App including recording and playback functions. In particular, the present invention may include a function of controlling sound pressure of audio upon recording, a function of notifying a sound pressure state of the audio upon playback, and a function of editing the audio.

With continued reference to FIG. 1, the RF communication unit 150 performs functions such as a voice call, a videophone call, or data communication under control of the controller 190. In order to perform the aforementioned functions, the RF communication unit 150 may include an RF transmitter for up-converting a frequency of a signal for transmission and amplifying the signal, and an RF receiver for low-noise-amplifying a received signal and down-converting a frequency of the signal. Further, the RF communication unit 150 may include a mobile communication module (third Generation (3G) mobile communication module, 3.5-Generation (3.5G) mobile communication module, fourth Generation (4G) mobile communication module, or the like), a near distance mobile module (e.g., wireless fidelity (Wi-Fi) module), a Bluetooth module, and a digital broadcasting module (e.g., DMB module).

The camera 160 photographs a subject and outputs an image of the photographed subject to the controller 190 to be processed for display by display unit 130 under control of the controller 190. The camera 160 may include a front camera disposed in a front surface of the mobile terminal and a rear camera disposed in a rear surface of the mobile terminal. The microphone 170 receives a voice from the outside, and generates and transfers an electric signal according to vibration to the controller 190 under the control of the controller 190. The microphone 170 may comprise, for example a piezoelectric or electro-restrictive element. The speaker 180 converts audio provided from the controller 190 into an audible sound, and outputs the audible sound. Here, the speaker 180 may be a example of a transducer.

Figure 3:
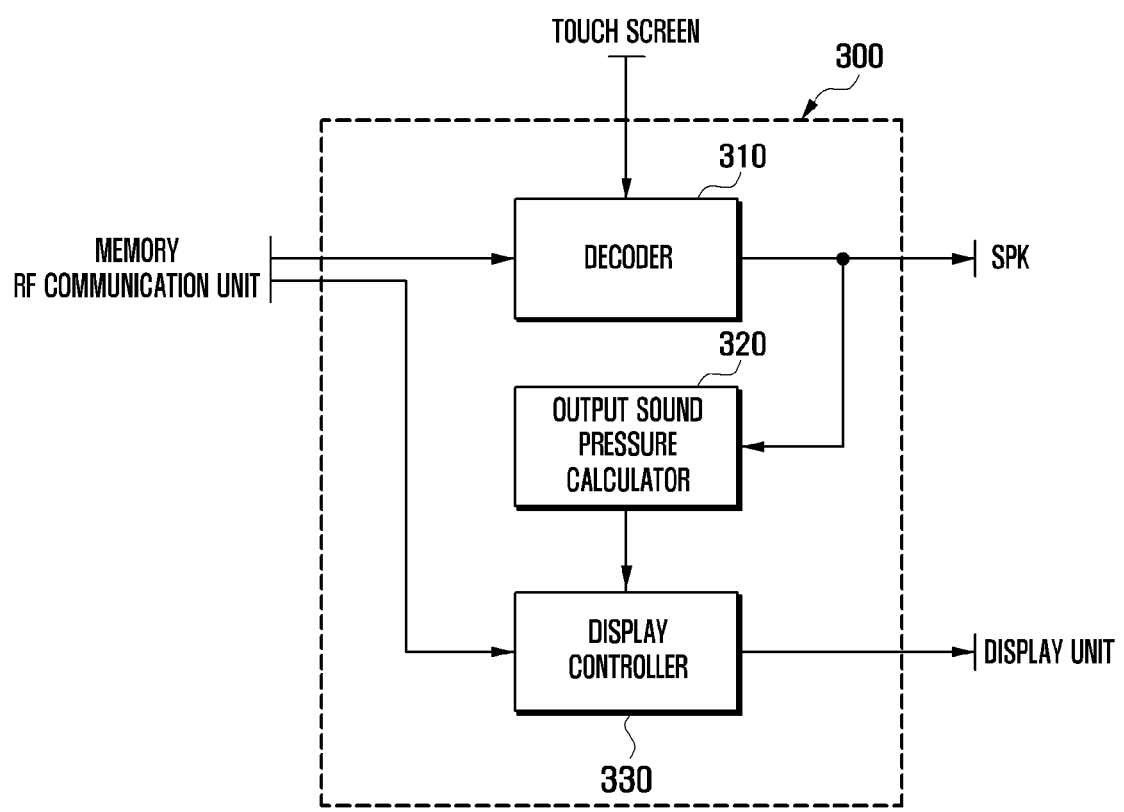
FIG. 3 is a block diagram illustrating a configuration of a player according to an exemplary embodiment of the present invention.
Figure 4:
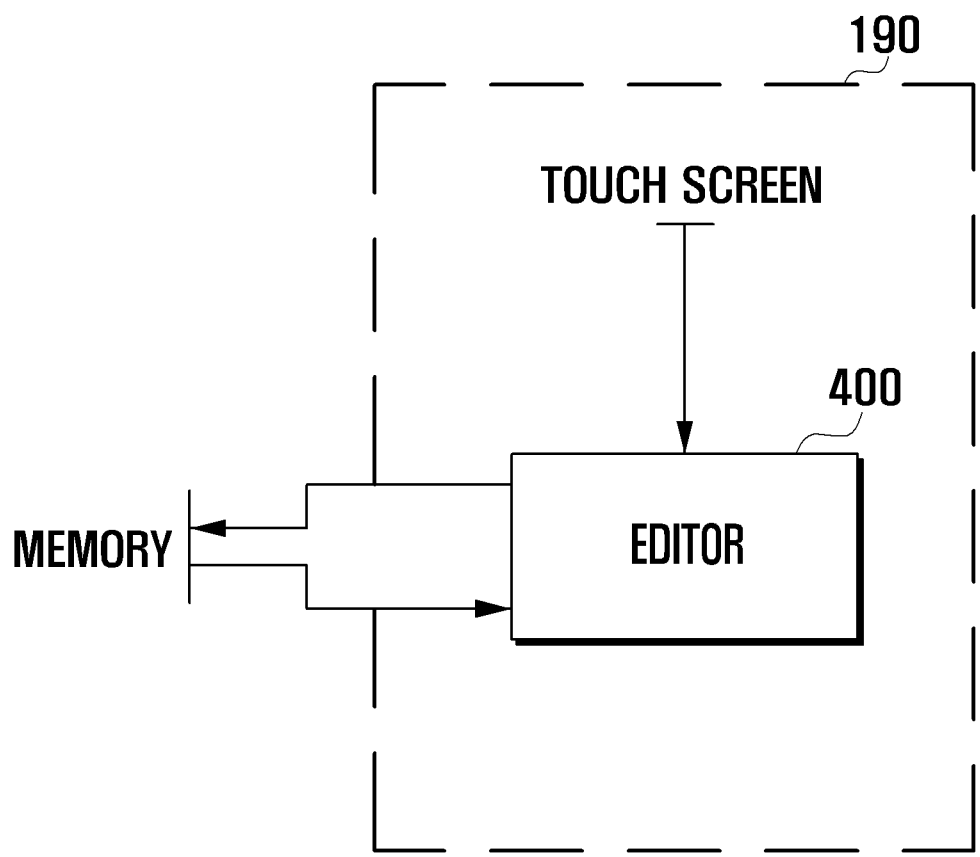
FIG. 4 is a block diagram illustrating a configuration of an editor according to an exemplary embodiment of the present invention.

The controller 190 may perform a control function of some or all of the other units in FIG. 1, such as for controlling a fan overall operation and signal flow between internal structural elements of the mobile terminal 100, and processing data. Furthermore, the controller 190 may control power supply from a battery to the internal structural elements. Further, the controller 190 may execute various applications stored in the program area. In particular, the controller 190 according to the present invention may preferably include a recorder, a player, and an editor as shown in FIGS. 2 to 4.

Figure 2:
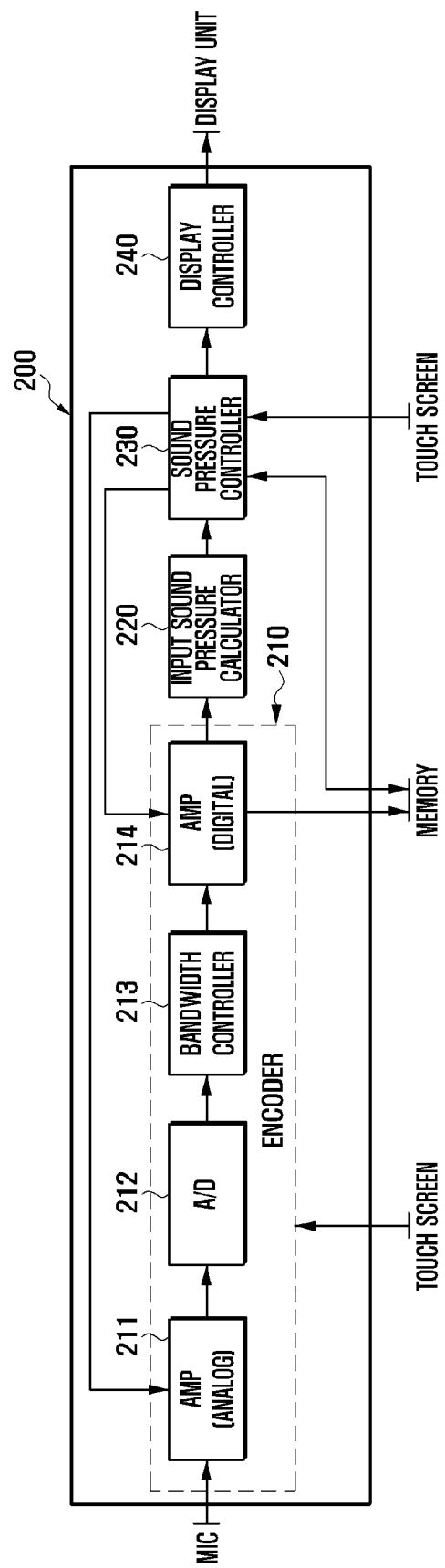
FIG. 2 is a block diagram illustrating a configuration of a recorder according to an exemplary embodiment of the present invention.

FIG. 2 is a block diagram illustrating a configuration of a recorder according to an exemplary embodiment of the present invention. The recorder may be configured integrally or separately from the controller 190. Hereinafter, it is assumed that the recorder is configured inside (integrally with) the controller 190.

Referring now to FIG. 2, a recorder 200 of the controller 190 according to an exemplary embodiment of the present invention may include an encoder 210, an input sound pressure calculator 220, a sound pressure controller 230, and a display controller 240.

The encoder 210 encodes audio input from the microphone 170 (FIG. 1). Specifically, the encoder 210 may include an analog amplifier 211, an analog digital converter (ADC) 212, a bandwidth controller 213, and a digital amplifier 214. The analog amplifier 211, for example, amplifies analog audio input from the microphone 170 and outputs the amplified audio. The ADC 212 converts the amplified analog audio into digital audio. The bandwidth controller 213 controls a bandwidth of the digital audio input from the ADC 212 and outputs the controlled digital audio. In other words, the bandwidth controller 213 preferably filters audio of remaining bands except for a frequency band corresponding to an audible sound from the digital audio input from the ADC 212. The digital amplifier 214 amplifies the digital audio input from the bandwidth controller 213 and transfers the amplified digital audio to the memory 140 and an input sound pressure calculator unit 220. The memory 140 may compress the digital audio input from the digital amplifier 214 into a preset audio format, and store the compressed digital audio.

The input sound pressure calculator 220 calculates input sound pressure level of the audio received from the digital amplifier 214. The sound pressure controller 230 receives the calculated sound pressure level of the input audio from the input sound pressure calculator 220. Further, the sound pressure controller 230 controls sound pressure level of the input audio from the microphone 170 based on the received sound pressure level. For example, the sound pressure controller 230 controls gains of the analog amplifier 211 and the digital amplifier 214 based on the received sound pressure level.

Specifically, when the received sound pressure level becomes in a saturation state, the sound pressure controller 230 controls the gains of the amplifiers 211 and 214 to be decreased.

Further, if the received sound pressure level becomes in a low level state, the sound pressure controller 230 controls the gains of the amplifiers 211 and 214 to be increased. The gains of the amplifiers 211 and 214 may be automatically controlled by the sound pressure controller 230. The gains of the amplifiers 211 and 214 may be manually configurable according to user input information input from a touch screen 110 or the like. The sound pressure controller 230 checks a setting value associated with presence of automatic control of sound pressure from the memory 130. When the checked setting value is 'automatic control', the gains are automatically controlled. When the checked setting value is 'manual control', the gains are manually set (i.e. configured). Further, the automatic control of the gains may be performed before and after start of recording. Specifically, when the recording App is executed, the sound pressure controller 230 may perform automatic gain control. If the user touches a start button for starting recording in a state in which a recording App is executed, the touch screen 110 transfers a touch event to the sound pressure controller 230. Then, the sound pressure controller 230 senses the touch event to perform automatic gain control.

Furthermore, with continued reference to FIG. 2, the sound pressure controller 230 transfers received state information of the sound pressure to the display controller 240. The display controller 240 controls the display unit 130 to display the received state information. Moreover, the sound pressure controller 230 transfers the received sound pressure state information of the sound pressure to the memory 140. Accordingly, the memory 140 stores the sound pressure state information associated with the audio input from the digital amplifier 214.

As illustrated above, the recorder 200 according to an exemplary embodiment of the present invention may record the audio input from the microphone 170 in a normal operating state without distortion. Moreover, the recorder 200 may notify a sound pressure state of the recorded audio to the user.

FIG. 3 is a block diagram illustrating a configuration of a player according to an exemplary embodiment of the present invention. The player may be configured inside or separately from the controller 190. Hereinafter, it is assumed that the player is configured inside the controller 190. Referring now to FIG. 3, a player 300 of the controller 190 according to an exemplary embodiment of the present invention may include a decoder 310, an output sound pressure calculator 320, and a display controller 330.

The decoder 310 decodes audio under control of a user using a touch screen 110 or the like. The decoder 310 may receive the audio from the memory 140. Further, the decoder 310 receives the audio from the RF communication unit 150. The audio received from the RF communication unit 150 may be streaming data which may be played in real time. Further, the decoder 310 may include a digital/analog converter (DAC) for converting received audio into analog audio and an analog amplifier for amplifying audio received from the DAC and output the amplified audio to the speaker 180.

With continued reference to FIG. 3, the output sound pressure calculator 320 AD-converts audio output from the decoder 310 to the speaker 180 and calculates output sound pressure level of the AD-converted audio. The output sound pressure calculator 320 may transfer the calculated sound pressure level to the display controller 330.

The display controller 330 controls the display unit 140 to display a sound pressure state of currently played audio. In this case, the displayed sound pressure state may be state information of input sound pressure level or output pressure level of the AD-converted audio. More specifically, the display controller 330 may receive state information of the input sound pressure level associated with the currently played audio from the memory 140 or the RF communication unit 150. Further, the display controller 330 may control the display unit 130 to display the received state information of the input sound pressure level. In the meantime, when the played audio is streaming data received from the RF communication unit 150, the display controller 330 may not receive the state information of the input sound pressure from the RF communication unit 150. If the played audio is received from the memory 140 but the state information of the input sound pressure level is not stored in the memory 140, the display controller 330 thus cannot receive the state information of the input sound pressure level from the memory 140. In this case, the display controller 330 may control the state information of output sound pressure level to be displayed. Specifically, the display controller 330 may control the output sound pressure calculator 320 to calculate output sound pressure level. Further, the display controller 330 may receive the output sound pressure level calculated from the output sound pressure calculator 320, determine in which sound pressure state (e.g. low-level, normal operating state, or saturation state) is the received sound pressure level, and control the display unit 130 to display the determined sound pressure state information.

As described above, the player 300 according to an exemplary embodiment of the present invention may monitor the sound pressure state information while playing the audio.

FIG. 4 is a block diagram illustrating a configuration of an editor according to an exemplary embodiment of the present invention. The editor 400 may be configured inside or separately from the controller 190. Hereinafter, it is assumed that the editor 400 is configured inside the controller 190.

Referring now to FIG. 4, the editor 400, according to an exemplary embodiment of the present invention, edits the audio such as insertion of an effect sound in the audio stored in the memory 140, or partial removal or correction of the audio under the control of the user using the touch screen 110. Particularly, the editor 400 may remove or correct a region in a saturation state from the audio.

The foregoing mobile terminal 100 may further include various additional modules according to different designs or models. In other words, when the mobile terminal 100 comprises a communication terminal, the apparatus may include various constructions that were not discussed hereinabove such as a near distance communication module for near distance communication, an interface exchanging data in a wired communication scheme or a wireless communication scheme of the mobile terminal 100, an Internet communication module communicating with an Internet to perform an Internet function, and a digital broadcasting module receiving and broadcasting digital broadcasting. Since the structural elements can be variously changed according to convergence trend of a digital device, no particular elements are listed. However, the present invention is not dependent upon such particular elements. Moreover, the mobile terminal 100 may include structural elements equivalent to the foregoing structural elements. Further, the mobile terminal 100 of the present invention may be substituted by specific constructions in the foregoing arrangements according to the provided form or another structure. Those skilled in the present art can appreciate and understand such substitutions/additions can be made that do not depart form the spirit of the invention nor the scope of the appended claims. Further, in the present invention, the input unit may comprise a touch pad or a track ball in addition to the touch screen 110 and/or in supplement to or replacement of the key input unit 120.

Hereinafter, a method for processing audio performed by the mobile terminal 100 having the construction as described above will be described.

Figure 5:
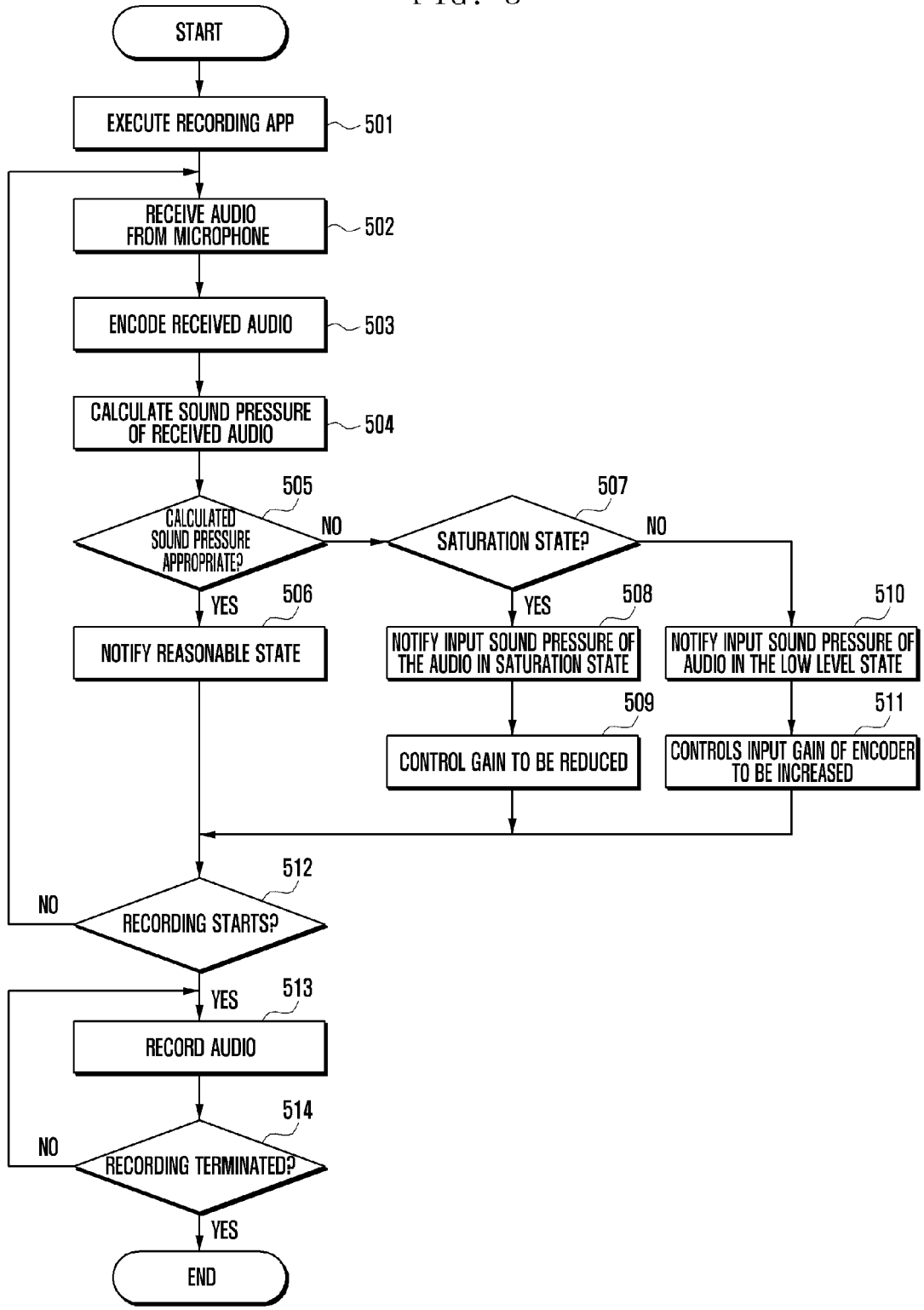
FIG. 5 is a flowchart illustrating exemplary operation of a method for processing audio according to an exemplary embodiment of the present invention.

FIG. 5 is a flowchart illustrating exemplary operation of a method for processing audio according to an exemplary embodiment of the present invention.

Referring now to FIG. 5, if at (501) a touch gesture associated with an execution request of the recording App is sensed in an idle state, a controller 190 executes a recording App. Further, the controller 190 may control the display unit 130 to display an execution screen of the recording App, for example, an image photographed by the camera 160. If the user selects a video photographing mode in the preview state (that is, a state that recording is not performed yet but an image real-time photographed by the camera 160 is displayed), then at (502) the controller 190 drives the microphone 170 and receives the audio from the microphone 170.

Next, at (503), the controller 190 encodes the received audio, and at (504) calculates sound pressure level of the received audio.

Still referring to FIG. 5, at (505), the controller 190 determines whether the calculated sound pressure level is appropriate, meaning a determination is made as to whether the calculated sound pressure level falls within a certain range (e.g. is in normal operating state) defined, for example, by upper and lower thresholds. The skilled person will appreciate that, in the case of n states, n corresponding ranges may be defined by, for example, n−1 threshold sound pressure values (or points).

According to the determination result in (505), when the calculated sound pressure level is appropriate (meaning it is within a preferred or optimal range), at (506) the controller 190 may notify the user that input sound pressure level of the audio is appropriate, and go to step 512. In this appropriate state, photographing and recording the video may start.

When the calculated sound pressure level is not appropriate at step (505), then at (507) the controller 190 determines whether the sound pressure level is in a saturation state.

According to the determination result, when the sound pressure level is in the saturation state, at (508) the controller 190 notifies/advises the user that input sound pressure level of the audio is in the saturation state. Video photographing and recording may not start in the saturation state. Furthermore, in response to being in the saturation state, at (509) the controller 190 controls an input gain of the encoder 210 to be reduced such that input sound pressure level of the audio becomes a normal operating state, and then performs step (512). Here, reduced control of input gain may be achieved automatically or manually in response to user selection.

As the determination result at step (507), when the sound pressure level is not in the saturation state but is in a low level state, then at (510) the controller 190 notifies/advises the user that the input sound pressure level of the audio is in the low level state. Such notification can be pictorial, graphical, text, visual, audio, and/or any combination thereof. Furthermore, at (511) the controller 190 controls an input gain of the encoder 210 to be increased such that the input sound pressure level of the audio becomes in a normal operating state then performs step (512). Here, increased control of the input gain may be performed automatically or manually.

Still referring to FIG. 5, at (512) the controller 190 determines whether recording starts. More particularly, at (512) when the input sound pressure level of the audio is not in the normal operating state or a touch gesture associated with a request for starting recording is not sensed, the controller 190 then performs step 502. Conversely, at (512) when the input sound pressure level of the audio is in the normal operating state or the touch gesture associated with a request for starting recording is sensed, the controller 190 at (513) records the audio.

Next, at (514), the controller 190 determines whether termination of the recording is selected. In other words, at (514) when a touch gesture associated with a request for terminating the recording is not sensed, the controller 190 continuously records the audio. Conversely, when the touch gesture associated with a request for terminating the recording is sensed, the controller 190 terminates the recording.

Figure 6:
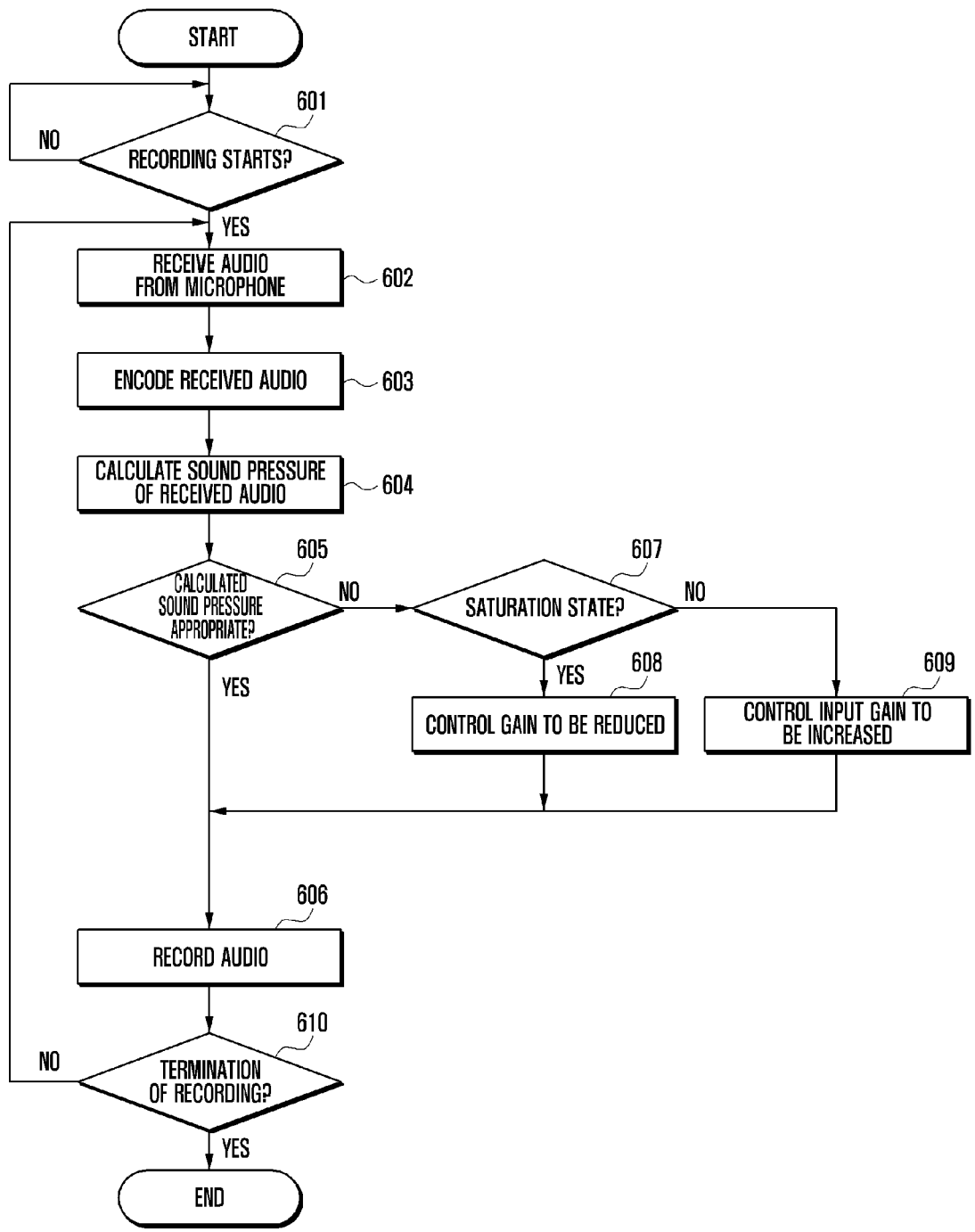
FIG. 6 is a flowchart illustrating exemplary operation of a method for processing audio according to another exemplary embodiment of the present invention.

FIG. 6 is a flowchart illustrating exemplary operation of a method for processing audio according to another exemplary embodiment of the present invention. In a general overview, a difference between FIG. 6 and FIG. 5 is there is no "notifying" the user. Although the recording starts in the normal operating state, the input sound pressure level of the audio may change to the saturation state according to a change in sound of the surrounding environment. Accordingly, there may be a need to control the input sound pressure level during recording.

Specifically, referring now to FIG. 6, at (601) if a recording starts, the controller 190 at (602) drives the microphone 170 and receives audio from the microphone 170. Next, at (603), the controller 190 encodes the received audio, and at (604) calculates sound pressure level of the received audio. Then at (605), the controller 190 determines whether the calculated sound pressure level is appropriate, which means whether it falls within a predetermined range. According to the determination result, the calculated sound pressure level is appropriate, and at (606) the controller 190 records the received audio.

When the calculated sound pressure level is determined as not being appropriate at step (605), then at (607) controller 190 determines whether the sound pressure level is in a saturation state. According to the determination result, when the sound pressure level is in the saturation state, the controller 190 at (608) controls an input gain of the encoder 210 to be reduced such that the input sound pressure level of the audio becomes in the normal operating state. Further, the controller 190 then performs step (606) and recording of the audio because the status has changed from the saturation state to the normal operating state by reducing the gain.

When the determination result at step 607, when the sound pressure level is not in the saturation state but is in a low-level state that is below the normal operating state, the controller 190 at (609) controls the input gain of the encoder 210 to be increased such that the input sound pressure level of the audio becomes in the normal operating state. Next, the controller 190 performs step (606) and records the audio because the status has changed from the low-level state to the normal operating state. The controller 190 controls performance of step (606) and then at (610) determines whether termination of the recording is selected. In other words, when the touch gesture associated with a request for terminating the recording is not sensed at step (610), the controller 190 returns to step (602). Conversely, when the touch gesture associated with the request for terminating the recording is sensed, the controller 190 terminates the recording.

Figure 7:
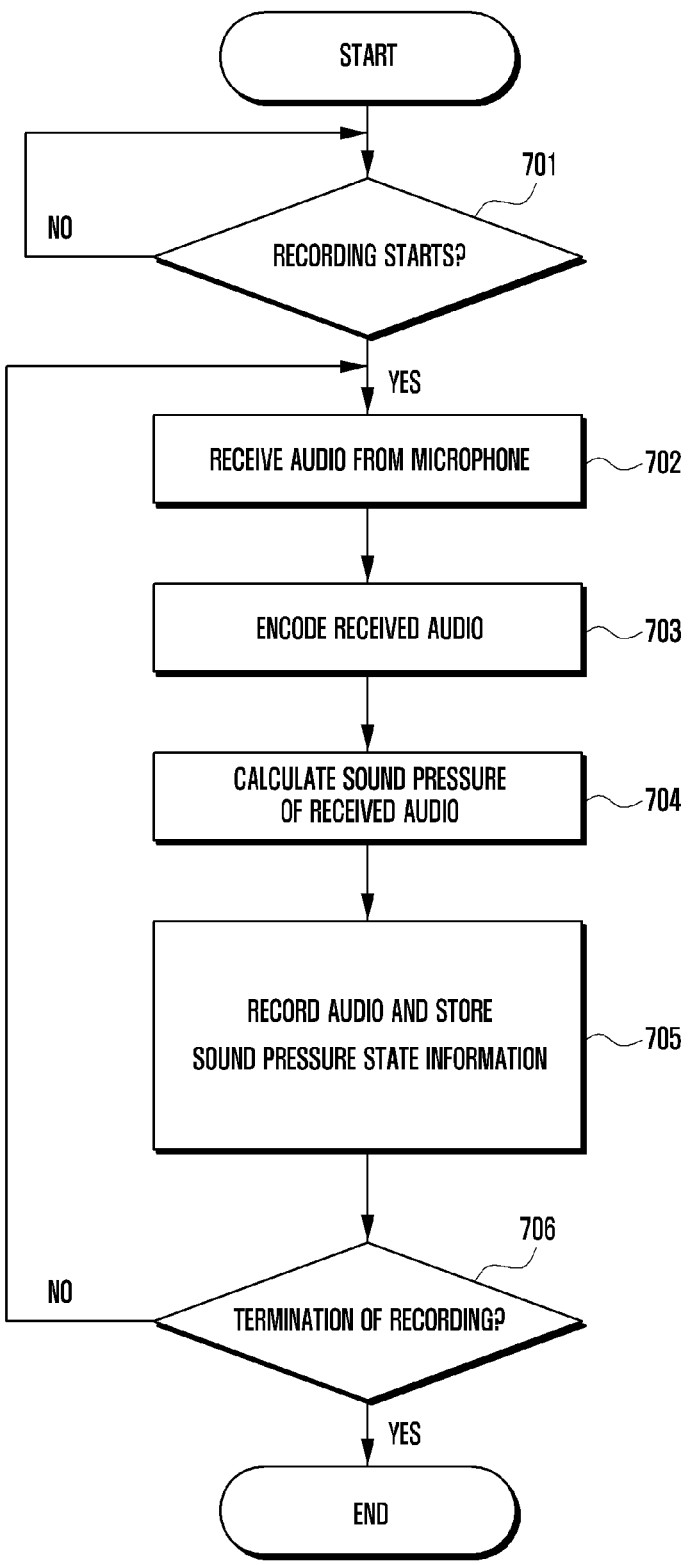
FIG. 7 is a flowchart illustrating exemplary operation of a method for processing audio according to a yet another exemplary embodiment of the present invention.

FIG. 7 is a flowchart illustrating exemplary operation of a method for processing audio according to a yet another exemplary embodiment of the present invention. More particularly, state information of input sound pressure level may be stored simultaneously with recording. Specifically, referring to FIG. 7, when it is determined that the recording starts (701), then at (702) controller 190 drive the microphone 170 and receives audio from the microphone 170. Next, at (703), the controller 190 encodes the received audio, and at (704) calculates sound pressure level of the received audio. Next, at (705) the controller 190 records the audio. At (705) the controller 190 checks which state is the calculated sound pressure level and stores the checked sound pressure state information. The controller 190 determines whether termination of the recording is selected. In other words, when the touch gesture associated with a request for terminating the recording is not sensed at step 706, the controller 190 then performs step (702). Conversely, when the touch gesture associated with the request for terminating the recording is sensed, the controller 190 terminates the recording.

Hereinafter, the method and the apparatus for processing audio according to an exemplary embodiment of the present invention is discussed with reference to a plurality of exemplary screen diagrams of a device such as, for example, a mobile terminal, or other such electronic device.

Figure 8:
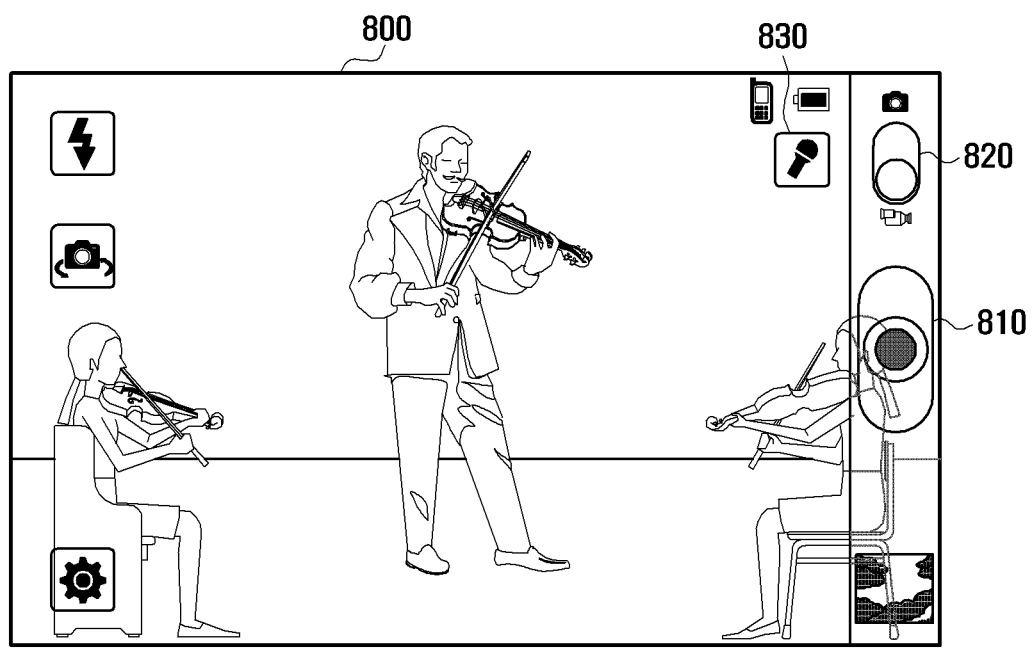
FIG. 8 is a diagram illustrating an example of a preview screen according to an exemplary embodiment of the present invention.

FIG. 8 is a diagram illustrating an example of a preview screen according to an exemplary embodiment of the present invention. Referring now to FIG. 8, the display unit 130 may display a preview screen 800 under control of the controller 190. Here, the preview screen 800 may be defined as an image photographed in real time by the camera 160. Furthermore, the display unit 130 may display a button 810 for starting and terminating the recording to overlap on the preview screen 800. Further, the display unit 130 may display a button 820 for selecting a photographing mode to overlap on the preview screen 800. Here, the photographing mode includes a photographing mode and a video photographing mode, and FIG. 8 shows a state that the mobile terminal is selected in the video photographing mode.

In a state that the mobile terminal is selected in the video photographing mode, a controller 190 may drive a microphone 170 and calculate an input sound pressure level of audio from the microphone 170. Further, the controller 190 may discriminate a state of input sound pressure level based on the calculated sound pressure level. Accordingly, the display unit 130 may display state information 830 of the input sound pressure level discriminated by the controller 190 to overlap on the preview screen 800. As described above, in the present invention, the sound pressure state may be classified into a saturation state, a normal operating state, and a low level state. Here, the low level state may be omitted according to a used environment. Accordingly, the controller 190 determines whether a state of the input sound pressure level is saturated. Accordingly, the display unit 130 may display state information associated with presence of saturation. In the meanwhile, saturation state information, normal operating state information, and low level state information may be displayed differently, for example using different colors assigned to respective states. For example, referring to FIG. 8, the state information 830 may be fundamentally displayed in the form of a microphone. Further, when the state of the input sound pressure level is the saturation state, the microphone may be displayed in red. When the state of the input sound pressure level is the normal operating state, the microphone may be displayed in blue. When the state of the input sound pressure level is the low level state, the microphone is displayed in yellow. Saturation state information, normal operating state information, and low level state information may be displayed differently in other ways such as using separate signs, characters, icons, or the like. Further, if the state of the input sound pressure level is the saturation state, the controller 190 may control the display unit 130 to display the state information 830, namely, such that the microphone is flicked as warning meaning.

Furthermore, in a state that the mobile terminal is selected in a video photographing mode, the controller 190 may automatically control the input sound pressure level to be in a normal operating state. As described above, if the calculated sound pressure level is in the saturation state, the controller 190 may control amplification gain of audio input from the microphone 130 to be reduced. In the meantime, when the calculated sound pressure level is in the low level state, the controller 190 may control the amplification gain of the input audio to be increased. If a button 810 on the touch screen 800 for starting and terminating recording is selected in a state that the mobile terminal, the controller 190 may firstly perform automatic gain control and start recoding. In the meantime, gain control may be manually performed. An example of manual control will now be described with reference to FIG. 9.

Figure 9:
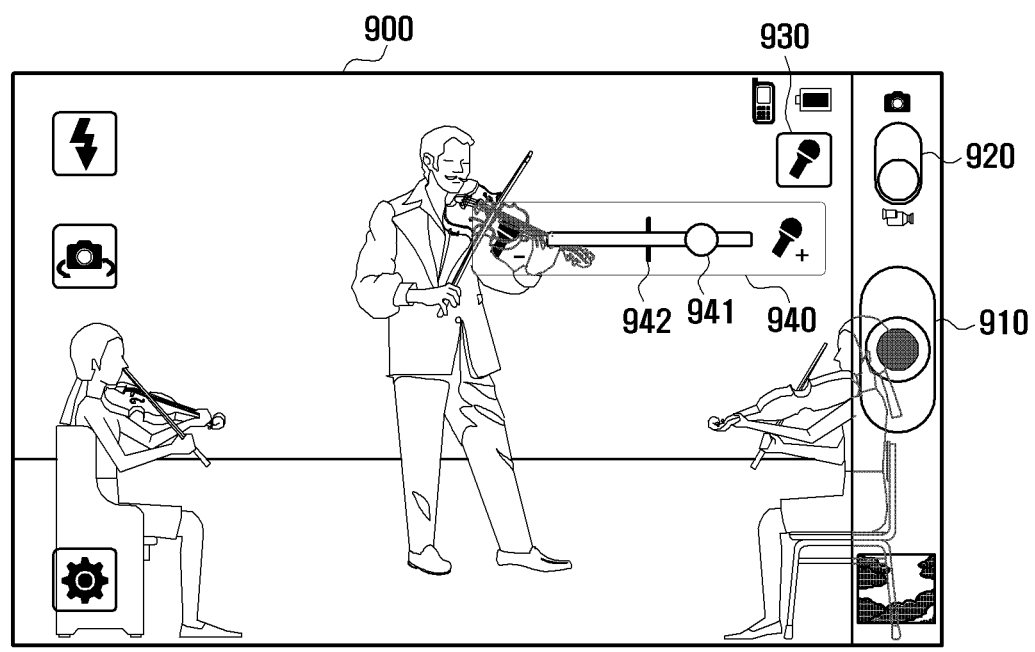
FIG. 9 is a diagram illustrating an example of a preview screen according to another exemplary embodiment of the present invention.

FIG. 9 is a diagram illustrating an example of a preview screen according to another exemplary embodiment of the present invention. Referring to FIG. 9, a display unit 130 may display the preview screen 900 under control of the controller 190. Further, the display unit 130 may display a button 910 for starting and terminating recording, a button 920 for selecting a photographing mode, and state information 930 of input sound pressure level to overlap on a preview screen 900. In addition, the display unit 130 may display an input sound pressure control bar 940 such that the input sound pressure level may be directly controlled by a user. If sound pressure level of audio input from the microphone 170 is in the saturation state, the controller 190 may control to display an input sound pressure control bar 940. The input sound pressure control bar 940 may include a first indicator 941 indicating a location of sound pressure level of current audio input from a microphone 170 and a second indicator 942 indicating a threshold point in which saturation of the input sound pressure level starts in a corresponding mobile terminal, namely, a location of the highest sound pressure level. The input sound pressure control bar 940 shown in FIG. 9 indicates that the input sound pressure level is in a current saturation state. The user drags the first indicator 941 to the left to control the input sound pressure level to a normal operating state. In other words, when a user drags the first indicator 941 to the left, the first indicator 941 controls amplification gain in proportion to a moved distance to be reduced.

Figure 10:
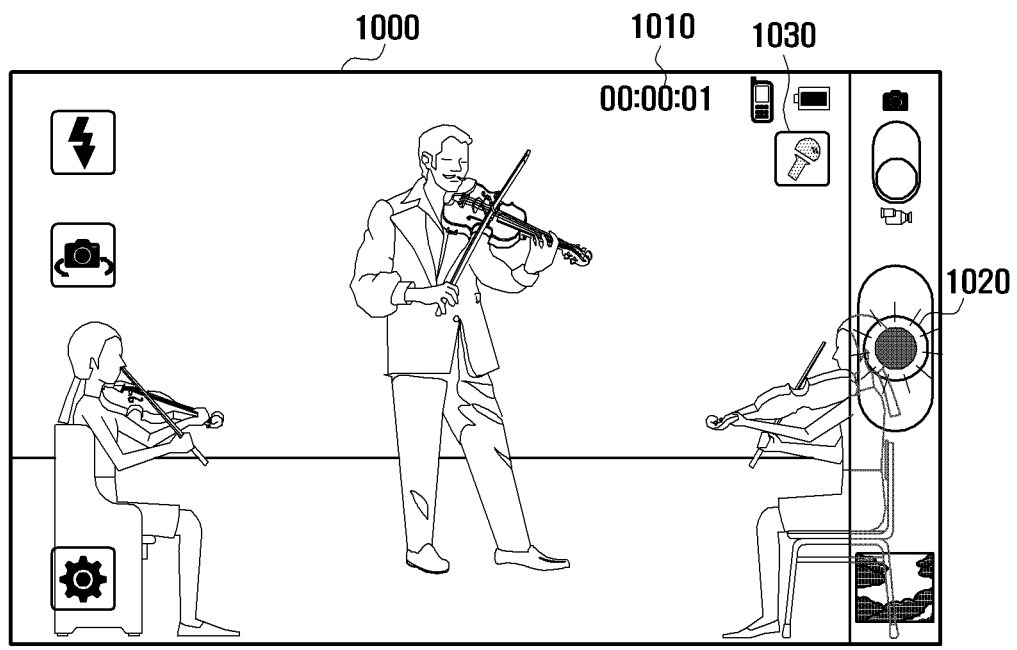
FIG. 10 is a diagram illustrating an example of a recording screen according to an exemplary embodiment of the present invention.

FIG. 10 is a diagram illustrating an example of a recording screen according to an exemplary embodiment of the present invention. Referring to FIG. 10, a display unit 130 may display a recording screen 1000 under control of the controller 190. Here, the recording screen 1000 may be defined as an image which the controller 190 receives and records from the camera 160. In such a recording state, the display unit 130 may display a recording time 1010 to overlap a recording screen 1000. Further, the display unit 130 may flicker a button for starting and terminating recording to notify to the user while the mobile terminal is being recorded.

Further, when the recording starts, the controller 190 may simultaneously start the recording. If the recording starts, the controller 190 calculates input sound pressure level of recorded audio, discriminates a state of the input sound pressure level based on the calculated sound pressure level, and stores discriminated sound pressure state information together with recorded audio. Moreover, the controller 190 may control the display unit 130 to display the discriminated sound pressure state information 1030. If the recording starts, the controller 190 may automatically control input sound pressure level such that the input sound pressure level of the audio is in a normal operating state.

Figure 11:
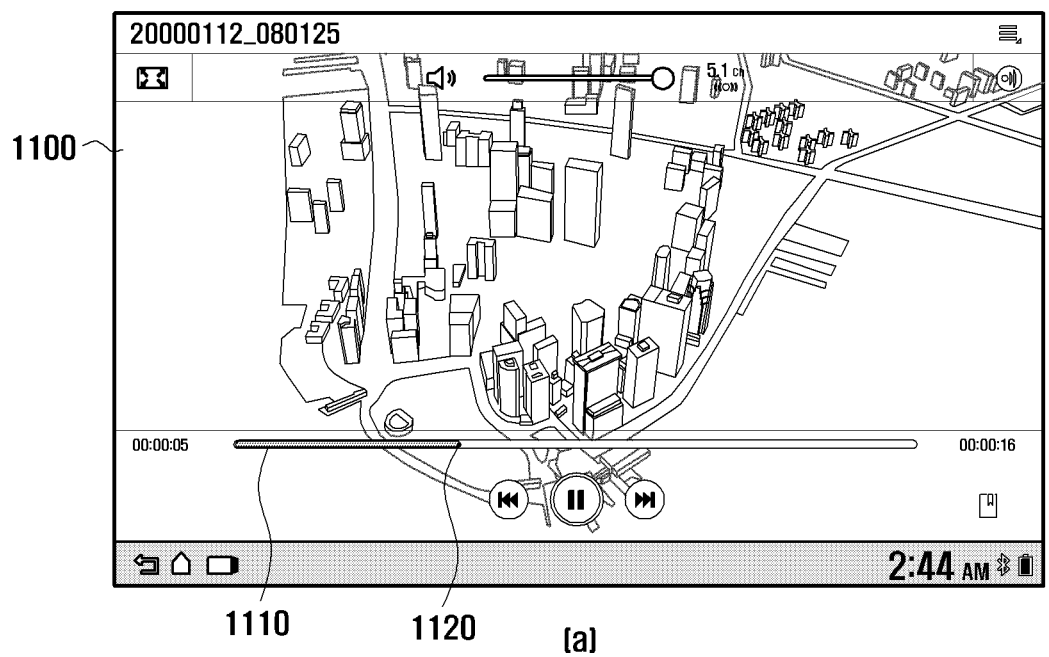
FIG. 11 is a diagram illustrating an example of a playback screen according to an exemplary embodiment of the present invention.
Figure 11:
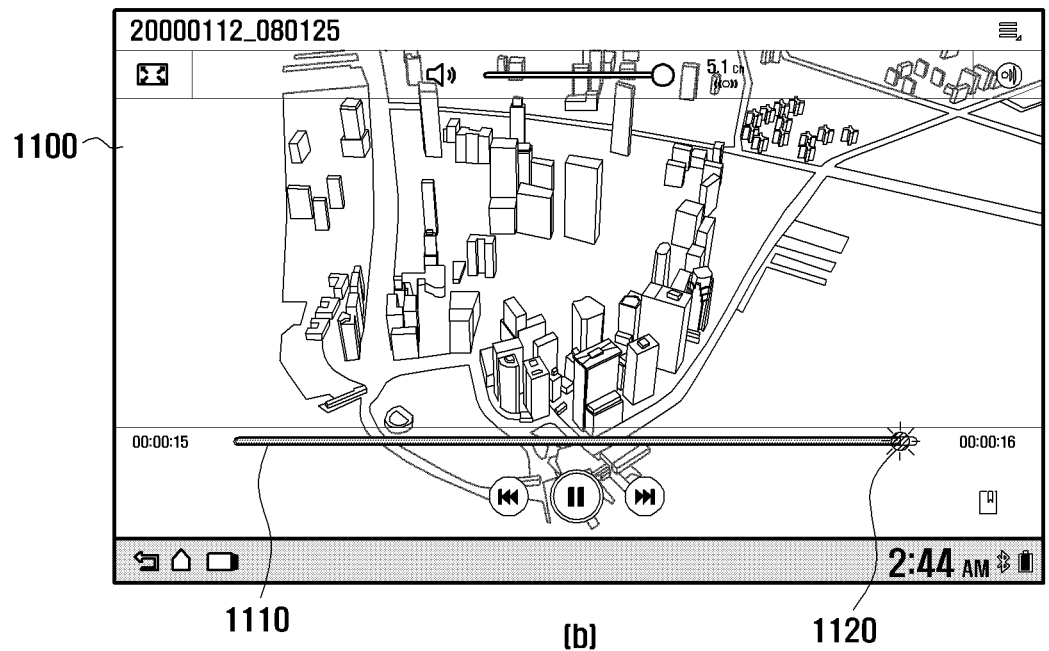

FIG. 11 is a diagram illustrating an example of a playback screen according to an exemplary embodiment of the present invention.

First, referring now to FIG. 11(*a*), a display unit 130 may display a playback screen 1100 under control of the controller 190. Here, the playback screen 1100 may be defined as a played image, and be an image downloaded from a network or a peripheral device through the RF communication unit 150 in real time or an image received from the memory 140.

In addition, the display unit 130 may display a playback progressing bar 1110 such that a user may know a location and a played section of an image played in video. Here, the playback progressing bar 1110 may include an indicator 1120 indicating a played location. Further, in an exemplary embodiment of the present invention, the playback progressing bar 1110 may include sound pressure state information of currently played audio together with an image. That is, the indicator 1120 may include the sound pressure state information. Specifically, a color of the indicator 1120 may be changed according to a state of the sound pressure level. For example, when the state of the sound pressure level is in a saturation state, the indicator 1120 is red. When the state of the sound pressure level is in a normal operating state, the indicator 1120 is blue. When the state of the sound pressure level is in a low level state, the indicator 1120 is yellow. The indicator 1120 may be displayed to be classified into separate signs, characters, icons, or the like according to a state of the sound pressure level. Referring now to FIG. 11(*b*), if the state of the sound pressure level is in a saturation state, the indicator 1120 may be flicked.

Further, the display unit 130 may display state information of input or output sound pressure level under control of the controller 190. The state information of the input or output sound pressure level may be included in the indicator 1120. As illustrated above, the state information of the input sound pressure level may be attribute information of audio stored in the memory 140 together with the audio or attribute information of audio downloaded from the RF communication unit 150 together with the audio. The state information of the output sound pressure level is state information obtained by calculating output sound pressure level of audio output from a decoder 310 to a speaker and discriminating based on the calculated sound pressure level by the controller 190.

In the meantime, the controller 190 according to an exemplary embodiment of the present invention may provide an edit function for audio and video. In particular, the controller 190 may remove or correct audio whose input sound pressure level is in a saturation state and a video frame associated with the input sound pressure level. Here, the correction means correcting a setting value of input sound pressure level during a corresponding audio section such that the input sound pressure level becomes in a normal operating state.

Figure 12:
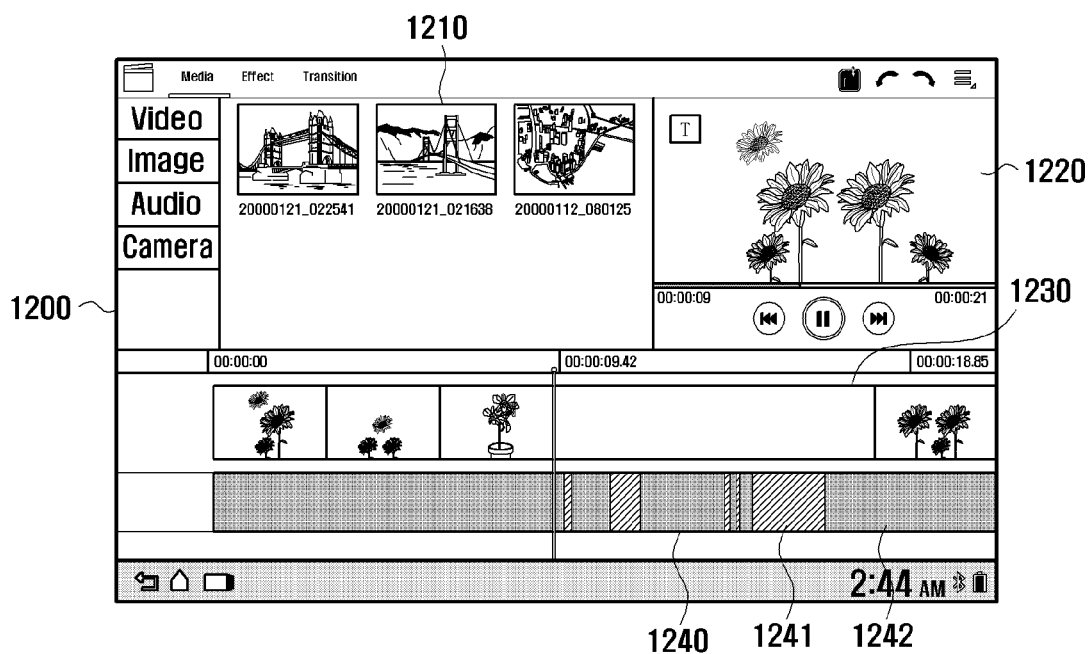
FIG. 12 is a diagram illustrating an example of an editing screen according to an exemplary embodiment of the present invention.

FIG. 12 is a diagram illustrating an example of an editing screen according to an exemplary embodiment of the present invention. Referring to FIG. 12, a display unit 130 may display the edit screen 1200 under control of the controller 190. Specifically, the edit screen 1200 may include video information stored in the memory 140. As shown, the video information may be displayed in the thumbnail form 1210. Although not shown, the video information may be displayed in the form of a list. Further, the edit screen 1200 may include the playback screen 1220. The edit screen 1200 may include a frame screen 1230 for displaying frames of a played video through the playback screen 1220. Further, the edit screen 1200 may include sound pressure state information 1240 of the played audio. The sound pressure state information 1240 may be classified for each color according to a sound pressure state. It may be assumed that reference numeral 1241 of FIG. 12 denotes a saturation state and reference numeral 1242 denotes a normal operating state. The user may edit audio and video through the edit screen 1200. In particular, the user may delete an audio section in the saturation state 1241 and a video section corresponding thereto. In addition, the user may correct the audio section in the saturation state 1241.

Figure 13:
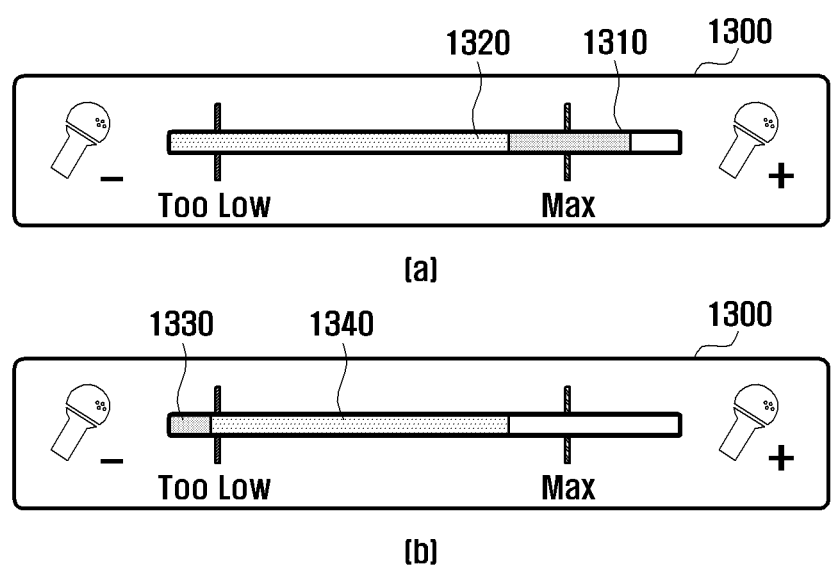
FIG. 13 is a diagram illustrating an example of a volume bar according to an exemplary embodiment of the present invention.

FIG. 13 is a diagram illustrating an example of a volume bar according to an exemplary embodiment of the present invention. Referring now to FIG. 13, the display unit 130 may display the volume bar 1300 under control of the controller 190. The volume bar 1300 indicates a volume of audio input from the microphone 170, and may be included in the foregoing preview screen, recording screen, playback screen, edit screen, and the like. Particularly, the volume bar 1300 indicates a volume before a gain is adjusted and a volume after the gain is adjusted. More specifically, referring to FIG. 13(*a*), reference numeral 1310 indicates a volume before reduction control and reference numeral 1320 indicates a volume after the reduction control. Meanwhile, referring to FIG. 13(*b*), reference numeral 1330 indicates a volume before increase control and reference numeral 1340 indicates a volume after the increased control.

The above-described methods according to the present invention can be implemented in hardware, firmware or as software or computer code that is loaded into hardware such as a microprocessor/processor and can be stored in non-transient recording medium such as a CD ROM, an RAM, a floppy disk, a hard disk, flash, or a magneto-optical disk or computer code downloaded over a network originally stored on a local or remote non-transitory machine readable medium, so that the methods described herein can be rendered in such software that is stored loaded into hardware such as a processor or microprocessor, or a special processor or in programmable or dedicated hardware, such as an ASIC or FPGA. A general purpose computer when loaded becomes a special purpose computer As would be understood in the art, the computer, the processor, microprocessor or controller are hardware elements and the claims are to be interpreted with such elements comprising hardware, and not to be interpreted as pure software that is outside the scope of a statutory invention. The programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

It will be appreciated that the storage devices and storage media are embodiments of machine-readable storage that are suitable for storing a program or programs comprising instructions that, when executed, implement embodiments of the present invention. Accordingly, embodiments provide a program comprising code for implementing apparatus or a method as claimed in any one of the claims of this specification, and a machine-readable storage storing such a program.

As described above, the present invention may control pressure of a played sound according to a peripheral environment to improve quality of the audio. Further, the present invention may notify a sound pressure state of the audio to a user to edit distorted audio.

Although the method and apparatus for processing audio according to exemplary embodiments of the present invention have been described in detail hereinabove, it should be clearly understood that many variations and modifications of the basic inventive concepts herein taught which may appear to those skilled in the present art will still fall within the spirit and scope of the present invention, as defined in the appended claims.

What is claimed is:

1. A method for processing audio in a mobile terminal, the method comprising:
receiving the audio from a microphone;
calculating a sound pressure level of the received audio by an input sound pressure calculator;
determining by a controller a sound pressure state of the received audio by comparing the calculated sound pressure level of the received audio with a preset highest sound pressure level to determine whether the calculated sound pressure level is in a saturation state;
storing the received audio in a memory;
editing a region in the saturation state from the stored audio,
wherein the editing of the region comprises removing or correcting the region.

2. The method of claim 1, wherein the determining whether the calculated sound pressure level is in a saturation state includes determining that the sound pressure of the received audio is higher than a threshold at which distortion occurs; when the calculated sound pressure level is higher than the highest sound pressure level.

3. The method of claim 2, wherein the storing of the received audio comprises recording the received audio when the calculated sound pressure level of the received audio is not in the saturation state and is in a normal operating state.

4. The method of claim 2, further comprising displaying on a display unit an input sound pressure level control bar allowing manually setting control of a gain of the sound pressure when the calculated sound pressure level of the received audio is in the saturation state.

5. The method of claim 4, wherein the input sound pressure control bar displayed on the display unit includes a first indicator indicating a location of sound pressure level of current audio input from the microphone and a second indicator indicating a threshold point in which saturation of the input sound pressure level starts in a corresponding mobile terminal being a location of the highest sound pressure level.

6. The method of claim 5, further comprising controlling by the controller an input gain of the audio according to change in a location of the first indicator.

7. The method of claim 1, further comprising controlling by the controller an input gain of the received audio to be reduced when the calculated sound pressure level of the received audio is in the saturation state.

8. The method of claim 7, wherein the controlling of the input gain comprises the controller controlling the input gain to be reduced such that the sound pressure level of the received audio changes from the saturation state to a normal operating state,
wherein the storing of the received audio comprises recording the received audio in the normal operating state, and
wherein the normal operating state is a state that the calculated sound pressure level is lower than the highest sound pressure level and higher than a preset lowest sound pressure level.

9. The method of claim 7, further comprising the controller notifying a user when the calculated sound pressure level of the received audio changes from the saturation state to a normal operating state as a reduction control result for the input gain.

10. The method of claim 1, further comprising displaying a determined sound pressure state information on a display unit.

11. The method of claim 1, further comprising storing a determined sound pressure state information in the memory.

12. The method of claim 11, further comprising displaying the stored sound pressure state information on a display unit when audio associated with the stored sound pressure state information is played.

13. The method of claim 12, further comprising deleting a video frame associated with a removed audio section from the memory.

14. An apparatus for processing audio in a mobile terminal, the apparatus comprising:
- a microphone outputting a received audio;
- a controller calculating a sound pressure level of the received audio from the microphone, and determining a sound pressure state of the received audio based on the calculated sound pressure level, and controlling an input gain of the received audio based on a determination result of the sound pressure state;
- a display unit displaying a determined sound pressure state information under control of the controller; and
- a memory storing the audio received from the controller and the determined sound pressure state information under control of the controller,
- wherein the controller comprises a recorder that records the audio received from the microphone, wherein the recorder includes:
- an encoder that encodes the audio received from the microphone;
- an input sound pressure calculator calculating the sound pressure level of the audio from the encoder;
- a sound pressure controller determining the sound pressure state of the received audio based on the sound pressure level received from the input sound pressure calculator, controlling an input gain of the encoder based on the determination result, and transferring the determined sound pressure state information to the memory; and
- a first display controller controlling the display unit to display the determined sound pressure state information received from the sound pressure controller.

15. The apparatus of claim 14, wherein the encoder comprises:
- an analog amplifier amplifying analog audio output from the microphone;
- an analog/digital converter that converts the analog amplified audio into a digital audio;
- a bandwidth controller that removes remaining components except for a frequency band corresponding to an audible sound from the digital audio from the analog/digital converter and outputting the digital audio from which the remaining components are removed; and
- a digital amplifier amplifying the digital audio received from the bandwidth controller.

16. The apparatus of claim 15, wherein the controller comprises a player that plays audio stored in the memory, and the player includes:
- a decoder that decodes the audio received from the memory and outputting the decoded audio to a transducer; and
- a second display controller receiving sound pressure state information associated with the played audio and controlling the display unit to display the received sound pressure state information.

17. The apparatus of claim 16, wherein the transducer comprises a speaker, and the player further comprises an output sound pressure calculator that converts the analog audio output from the decoder to the speaker into digital audio, and calculates output sound pressure level of the digital audio, and
the second display controller receives the output sound pressure level, and controls the display unit to display state information of the received output sound pressure level.

18. The apparatus of claim 16, wherein the controller further comprises an editor unit editing an audio section of the received audio whose input sound pressure level is in a saturation state from the audio played by the player.

* * * * *